March 25, 1969 J. W. SAUBER 3,435,353

AMPLIFIER-DETECTOR HAVING WIDE DYNAMIC RANGE

Filed Feb. 4, 1966

INVENTOR.
JAMES W. SAUBER,
BY Charles A. Weigel, Jr.

3,435,353
AMPLIFIER-DETECTOR HAVING WIDE DYNAMIC RANGE

James W. Sauber, Winchester, Mass., assignor to Hewlett-Packard Company, a corporation of California Filed Feb. 4, 1966, Ser. No. 525,171
Int. Cl. G06g 7/24
U.S. Cl. 328—145 8 Claims This invention relates to signal detectors and, more particularly, to amplifier-detectors for producing a direct current output signal which is logarithmically related to an alternating current (A.C.) input signal.

In many applications it is desirable to have an amplifier whose gain is a logarithmic function. Such logarithmic amplifiers are particularly useful where the input signal to the amplifier varies over a wide amplitude range. Amplifiers having gains responsive to a logarithmic function are well-known in the art but unfortunately often lack characteristics that make them useful with input signals having a "fast modulation" rate since their response time is slow compared to the modulation rate. This slow response time causes inaccuracies in the desired logarithmic relationship of the input to the output signal.

One particular approach taken in the prior art to achieve the amplification and detection of A.C. signals having a relatively large dynamic amplitude range has been to employ successive detection techniques. Systems employing such techniques are described, for example, in U.S. Patent 2,515,187 issued to W. R. Bliss on July 18, 1950 and Patent 2,729,743 issued to J. S. Le Grand on Jan. 3, 1956. In such systems several alternating current amplifiers are cascaded with the output of each amplifier being directed simultaneously to a detector circuit and to the following amplifier. All detector outputs are combined at a common summing point. With low level input signals only the last detector in the cascade contributes appreciably to the current applied to the summing junction. As the signal level increases, however, more and more detectors contribute and the last amplifier stages tend to overload such that the outputs from their detectors achieve a limiting or constant level. The detector output vs. A.C. input characteristic is compressive, that is to say, roughly logarithmic over a wide range of input signal amplitude variation. Unfortunately, with the more demanding equipment specifications required of present-day data systems, this approximate logarithmic characteristic is not always satisfactory.

It is, therefore, an object of this invention to obviate many of the disadvantages of the prior art signal amplifiers.

Another object of this invention is to provide an improved amplifier-detector having a logarithmic output-input characteristic.

In accordance with a preferred embodiment of this invention, several linear A.C. amplifiers are connected in cascade. The output of each amplifier, in addition to being connected to a succeeding amplifier, is also connected to a linear detector. In turn, the output of each detector is connected to a wave shaping circuit, the output of which is a logarithmic function of its input over a certain amplitude range. Below this range the output of the wave shaping network is negligible and above this range the output remains substantially constant. By assigning substantially identical fixed gains to each of the amplifiers such that the associated detector on its left commences operation at the input signal level for which its following detector just begins to limit, an output signal that varies as a continuous logarithmic function of the input signal amplitude over a wide amplitude range of input signals can be attained simply by summing the outputs of each of the wave shaping circuits.

The novel features that are considered characteristic of this invention are set forth with particularity in the appended claims. The invention, itself, however, both as to its organization and method of operation, as well as additional objects and advantages thereof, will best be understood from the following description when read in connection with the accompanying drawings, in which:

Figure 1:
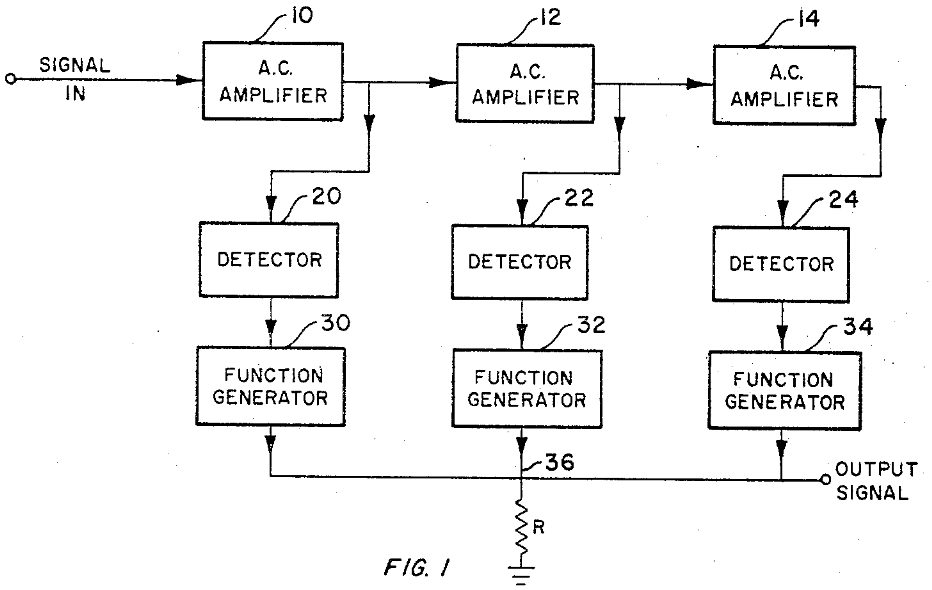
FIGURE 1 is a block diagram of a wide dynamic range amplifier-detector constructed in accordance with a preferred embodiment of this invention.

Referring now to the drawings, the block diagram of FIG. 1 includes a plurality of amplifier stages 10, 12, 14 connected in series combination or cascade. An amplitude modulated A.C. input signal is connected to the input terminals of the first amplifier stage 10. The output of each of the amplifier stages 10, 12 and 14, respectively, is coupled to a suitable detecting network of any conventional type, here illustrated by the blocks 20, 22, and 24. The detecting networks 20, 22, and 24 may be either peak or full wave average linear detectors of suitable design. The outputs of the respective detectors 20, 22, and 24 are each connected to a suitable wave shaping network 30, 32, and 34, respectively. Suitable wave shaping networks, designated as function generators in the drawing, may be any type which is capable of generating or providing an output signal that varies as a logarithmic function of an input signal. Networks of this type are well known and may, for example, utilize diodes connected in parallel and suitably biased such that each conducts at a different amplitude level of the input signal to successively approximate the log function of the input signal. The outputs of each of the wave shaping networks 30, 32, 34 are connected to a common summing point 36 which may comprise a summing resistor R connected to a point of reference potential or ground.

Further in accordance with the invention, each of the amplifiers 12 and 14 is assigned a substantially identical fixed gain such that its associated detector on the left, in the drawing, begins to operate at the input level for which the detector on its right is just beginning to limit. Each of the amplifiers is designed to provide an output that is a substantially linear function of the A.C. input signal applied to its input until the input signal is of sufficient amplitude to saturate the particular stage. When this amplitude level is reached the output of the amplifier does not increase further but rather remains substantially constant at that limiting amplitude. Limiting amplifiers of this type are well known.

Figure 2:
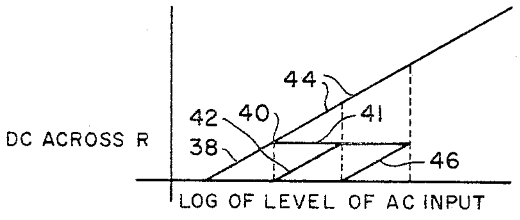
FIGURE 2 is a plot of the D.C. output voltage plotted as the ordinate derived from the system of FIG. 1 vs. the log of the amplitude level of the A.C. input signal plotted as the abscissa.

The operation of this circuit may perhaps be more clearly understood with reference to FIG. 2 in which the logarithim of the amplitude of the A.C. signal applied to the input of the amplifier-detector shown in FIG. 1 is plotted as the abscissa and the resulting D.C. output signal developed across the summing resistor R is plotted as the ordinate. With the lowest amplitude input signal, neither of the first two detectors 20 and 22 provide any output signal. Only the third detector 24 provides an output, as illustrated by the response curve 38 in FIG. 1. Once the limiting point 40 for the third amplifier 14 is reached, regardless of additional increases in the amplitude of the A.C. input signal, no further amplitude increase is provided by the third detector 24 as denoted by the horizontal saturation or limiting line 41. At this limiting point 40, however, the second detector 22 becomes active and begins to contribute to the output signal as evidenced by the response line 42. This additional signal, when added in the resistor R to the output of the third detector 24, provides the output signal represented by the sloping straight line 44. The contribution to the output signal by the first detector 20 is represented by the line 46. Each detector is operative over a limited amplitude range of the input signal. Since the output of each detector is accurately converted to a logarithmic function by the respective wave shaping networks 30, 32, and 34, the total or cumulative effect which is summed by the summing resistor R is a relatively accurate log function of the input signal amplitude.

Figure 3:
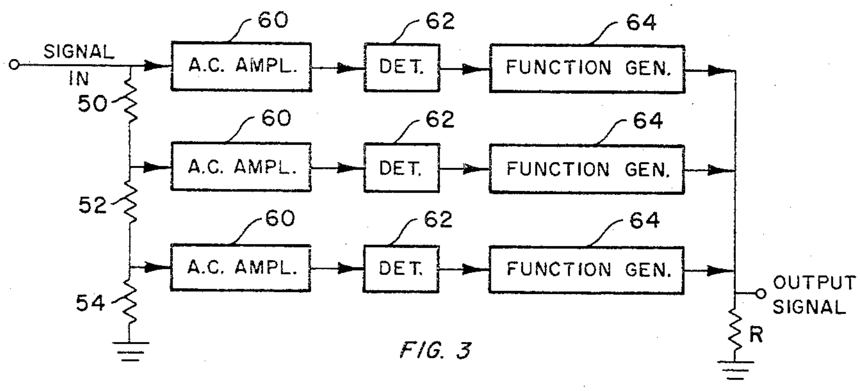
FIGURE 3 is a block diagram of a wide dynamic range amplifier-detector constructed in accordance with another embodiment of the invention.

The alternative embodiment illustrated in FIG. 3 is a parallel cascade arrangement of an amplifier-detector using essentially the same components that are employed in the embodiment illustrated in FIG. 1. In FIG. 3 the modulated alternating current input signal is applied across an attenuator network illustrated as comprising resistors 50, 52, and 54. The function of this attenuator is to modify by a factor or attenuate the amplitude of the input signal in substantially equal db steps. The input signal itself and the attenuated input signals derived from each of the junctions 56 and 58 of the attenuator network are amplified by respective A.C. amplifiers 60. The amplified signal from each of the A.C. amplifiers 60 is detected by a separate detector 62 and the detected output signal from each of the detectors 62 is modified by respective wave shaping networks, denoted by the function generator blocks 64. Each of the A.C. amplifiers 60, detectors 62, and function generators 64 may be of the same type described in conjunction with FIG. 1. The outputs of each of the function generators 64 are tied together and summed across a summing resistor R to provide the output signal. Since the operation of this circuit is substantially the same as that described in conjunction with FIG. 1, little more need be said to aid in the description of this embodiment of the invention.

In still other embodiments various combinations of the series cascade and parallel cascade embodiments of FIGS. 1 and 2 may be employed as desired. The particular configuration employed will depend upon the input signal available, the noise levels that can be tolerated, and the magnitude of the output signal desired.

There has thus been provided arrangements for logarithmically shaping the output signal derived from each detector connected to the output of successive cascaded amplifiers. These arrangements permit a relatively accurate amplifier-detector having wide dynamic range.

It will be obvious that various modifications may be made in the apparatus and in the manner of operating it. It is intended to cover such modifications and changes as would occur to those skilled in the art, as far as the following claims permit and as far as consistent with the state of the prior art.

What is claimed is:

1. A logarithmic amplifier-detector comprising:

a plurality of modifying means connected in series for modifying the amplitude of an electrical signal by substantially the same factor, means for applying a signal to be amplified and detected as the input signal to the first one of said modifying means, detecting means coupled to each of said modifying means for rectifying the signal derived therefrom, shaping means coupled to each of said detecting means for logarithmically varying the amplitude of the rectified output signal of each of said detecting means, and combining means to combine the shaped and rectified output signals of all of said modifying means whereby the output of said combining means is proportional in amplitude to the logarithm of said input signal.

2. The amplifier-detector set forth in claim 1 wherein each of said modifying means are signal attenuators.

3. The amplifier-detector set forth in claim 2 which includes:

a plurality of voltage amplifiers each adapted to receive a single input signal and to provide an output signal having an amplitude that is a linear function of the amplitude of the input signal to that amplifier for all values of input signals below a predetermined amplitude and having a substantially constant amplitude for all values of signals above said predetermined amplitude, each of said voltage amplifiers being connected between a different one of said modifying means and a different one of said detecting means.

4. The amplifier-detector set forth in claim 3 wherein each of said shaping means includes means for successfully approximating the logarithmic function.

5. The amplifier-detector set forth in claim 3 wherein the gain of each of said amplifiers is related to the dynamic operating range of each of said detecting means.

6. The amplifier-detector set forth in claim 1 wherein each of said modifying means are voltage amplifiers adapted to receive a single input signal and to provide an output signal having an output that is a linear function of the amplitude of the input signal to that amplifier for all values of input signals below a predetermined amplitude and having a substantially constant amplitude for all values of signals above said predetermined amplitude.

7. The amplifier-detector set forth in claim 6 wherein each of said shaping means includes means for successfully approximating the logarithmic function.

8. The amplifier-detector set forth in claim 6 wherein the gain of each of said amplifiers is related to the dynamic operating range of said detecting means.

References Cited

UNITED STATES PATENTS

| | | | |
|---|---|---|---|
| 2,577,750 | 12/1951 | Belleville | 328—145 |
| 3,371,224 | 2/1968 | Polo | 307—229 |

ARTHUR GAUSS, *Primary Examiner.*

D. D. FORRER, *Assistant Examiner.*

U.S. Cl. X.R.

307—229; 329—146